United States Patent
Lin et al.

(10) Patent No.: US 10,496,138 B2
(45) Date of Patent: Dec. 3, 2019

(54) LINKAGE MECHANISM AND ELECTRONIC DEVICE

(71) Applicants: Shu-Hung Lin, Taipei (TW);
Wang-Hung Yeh, Taipei (TW);
Shih-Chin Chou, Taipei (TW);
Hsin-Chieh Fang, Taipei (TW);
Ping-Chu Tsai, Taipei (TW);
Chun-Wen Wang, Taipei (TW);
Che-Hsien Lin, Taipei (TW)

(72) Inventors: Shu-Hung Lin, Taipei (TW);
Wang-Hung Yeh, Taipei (TW);
Shih-Chin Chou, Taipei (TW);
Hsin-Chieh Fang, Taipei (TW);
Ping-Chu Tsai, Taipei (TW);
Chun-Wen Wang, Taipei (TW);
Che-Hsien Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/177,429

(22) Filed: Nov. 1, 2018

(65) Prior Publication Data
US 2019/0155338 A1    May 23, 2019

Related U.S. Application Data

(60) Provisional application No. 62/580,437, filed on Nov. 1, 2017.

(51) Int. Cl.
*G06F 1/16* (2006.01)
*G06F 1/3234* (2019.01)
*H05K 5/02* (2006.01)

(52) U.S. Cl.
CPC .......... *G06F 1/1679* (2013.01); *G06F 1/1616* (2013.01); *G06F 1/1643* (2013.01);
(Continued)

(58) Field of Classification Search
None
See application file for complete search history.

(56) References Cited

U.S. PATENT DOCUMENTS 8,964,363 B2 *   2/2015   Hu ............................ G06F 3/02
                                                                    16/221
9,329,632 B2 *   5/2016   Chang ................... G06F 1/1632
(Continued)

FOREIGN PATENT DOCUMENTS

TW    I307006    3/2009
TW    I544308    8/2016

*Primary Examiner* — Xanthia C Cunningham
(74) *Attorney, Agent, or Firm* — JCIPRNET (57) ABSTRACT

A linkage mechanism including a base, at least one first linking rod, a first linkage member and a driving member is provided. Each of the at least one first linking rod includes a first pivot portion and a second pivot portion. Each of the first linking rod is pivoted to the base via the first pivot portion. The first linking member includes a first engaged portion and a first groove along a first direction. Each of the first linking rod is pivoted in the first groove of the first linkage member via the second pivot portion. The first linking rod is connected to the driving member. When the driving member is located at an unlocked position, the first engaged portion is retracted inside the base. When the driving member is moved from the unlocked position to a locked position, the first linking rod is driven by the driving member, so that the first linkage member is moved along a second direction, and the first engaged portion protrudes from the base. An electronic device is further provided.

22 Claims, 7 Drawing Sheets

(52) U.S. Cl.
CPC .......... *G06F 1/1654* (2013.01); *G06F 1/1669* (2013.01); *G06F 1/3275* (2013.01); *H05K 5/0217* (2013.01); *G06F 1/1681* (2013.01)

(56) References Cited

U.S. PATENT DOCUMENTS

| | | | |
|---|---|---|---|
| 9,541,956 B2* | 1/2017 | Chen | G06F 1/1632 |
| 9,651,993 B2* | 5/2017 | Huang | G06F 1/1632 |
| 9,898,043 B2* | 2/2018 | Agata | G06F 1/1632 |
| 2008/0055844 A1* | 3/2008 | Kobayashi | G06F 1/1632 |
| | | | 361/679.43 |
| 2010/0091446 A1* | 4/2010 | Kuo | G06F 1/1632 |
| | | | 361/679.43 |
| 2010/0103613 A1* | 4/2010 | Yang | G06F 1/1616 |
| | | | 361/679.58 |
| 2012/0218722 A1* | 8/2012 | Yu | F16M 11/041 |
| | | | 361/747 |
| 2013/0155583 A1* | 6/2013 | Yang | G06F 1/1626 |
| | | | 361/679.01 |
| 2014/0153162 A1* | 6/2014 | Kim | G06F 1/1632 |
| | | | 361/679.01 |
| 2016/0062402 A1* | 3/2016 | Matsumoto | G06F 1/1632 |
| | | | 361/679.43 |
| 2016/0105978 A1* | 4/2016 | Xu | F16B 2/12 |
| | | | 248/220.22 |

* cited by examiner

LINKAGE MECHANISM AND ELECTRONIC DEVICE

CROSS-REFERENCE TO RELATED APPLICATION

This application claims the priority benefit of U.S. provisional application Ser. No. 62/580,437, filed on Nov. 1, 2017. The entirety of the above-mentioned patent application is hereby incorporated by reference herein and made a part of this specification.

BACKGROUND

Technical Field

The invention relates to a linkage mechanism and an electronic device, and more particularly relates to a linkage mechanism used for fixing and an electronic device having the linkage mechanism.

Description of Related Art

At present, upper bodies of some laptops may be detached from their lower bodies, and be used as tablets. However, if the upper body and the lower body of the laptop are inconvenient to be disassembled or assembled, the user's operating smoothness may be affected. How to provide a mechanism for the user to simply operate is the research direction in this field.

SUMMARY

The invention provides a linkage mechanism, which may be used for fixing and may be simply operated.

The invention provides an electronic device having the aforementioned linkage mechanism.

The linkage mechanism of the invention includes a base, at least one first linking rod, a first linkage member and a driving member. Each of the at least one first linking rods includes a first pivot portion and a second pivot portion. Each of the at least one first linking rod is pivoted to the base via the first pivot portion. The first moving member includes a first engaged portion and a first groove along a first direction. Each of the at least one first linking rod is pivoted in the first groove of the first linkage member via the second pivot portion, and is adapted to be moved along the first groove. The at least one first linking rod is connected to the driving member, and is adapted to be moved between an unlocked position and a locked position. When the driving member is located at the unlocked position, the first engaged portion of the first linkage member is retracted inside the base. When the driving member is moved from the unlocked position to the locked position, the at least one first linking rod is driven by the driving member, so that the second pivot portion of the first linking rod is moved along the first groove, and the first linkage member is further moved along a second direction, and the first engaged portion protrudes from the base.

The invention provides an electronic device including a first body and a second body. The first body includes a linkage mechanism. The linkage mechanism includes a base, at least one first linking rod, a first linkage member and a driving member. Each of the at least one first linking rod includes a first pivot portion and a second pivot portion. Each of the at least one first linking rod is pivoted to the base via the first pivot portion. The first linking rod includes a first engaged portion and a first groove extending along a first direction. Each of the at least one first linking rod is pivoted in the first groove of the first linkage member via the second pivot portion, and is adapted to be moved along the first groove. The at least one first linking rod is connected to the driving member, and is adapted to be moved between the unlocked position and the locked position. The second body is detachably disposed on the first body, and includes a through hole, a plurality of inner side walls surrounding the through hole, and a recessed hole recessed in one of the inner side walls, where the linkage mechanism of the first body is adapted to be extended into the through hole of the second body. When the linkage mechanism of the first body is extended into the through hole of the second body, and the driving member is located at the unlocked position, the first engaged portion of the first linking member is retracted inside the base. When the driving member is moved from the unlocked position to the locked position, the at least one first linking rod is driven by the driving member, so that the second pivot portion of the first linking rod is moved along the first groove. The first linkage member is further moved along a second direction, so that the first engaged portion protrudes from the base, and extends into a recess hole of the second body.

In an embodiment of the invention, the linkage mechanism further includes a second linking rod, including a plurality of the first protruding portions, wherein the at least one first linking rod includes a plurality of first linking rods, and the first protruding portions of the second linking rod respectively pass through the second pivot portions of the first linking rods and the first groove of the first linkage member.

In an embodiment of the invention, the driving member includes a guide rail extending along the second direction, and one of the first protruding portion extends into the guide rail.

In an embodiment of the invention, the linkage mechanism further includes a cover, including a through groove. The driving member is movably disposed at the cover, and at least one of the guide rail and the first protruding portion extending into the guide rail passes through the through groove.

In an embodiment of the invention, the aforementioned base includes a first side wall, and a first opening formed on the first side wall. When the driving member is moved from the unlocked position to the locked position, the first engaged portion of the first linkage member is moved along a wall surface of the first side wall surrounding the first opening in a second direction to protrude from the base.

In an embodiment of the invention, the aforementioned linkage mechanism further includes a connector, fixed to the first linkage member. When the driving member is located at the unlocked position, the connector is retracted inside the base. When the driving member is moved from the unlocked position to the locked position, the connector is driven by the first linkage member and protrudes from the base.

In an embodiment of the invention, the aforementioned linkage mechanism further includes a second linkage member, including a second engaged portion and a second groove extending along a first direction, where each of the at least one first linking rod includes a third pivot portion. Each of the at least one first linking rods is pivoted in the second groove of the second linkage member via the third pivot portion so as to be adapted to be moved and rotated along the second groove. When the driving member is located at the unlocked position, the second engaged portion of the second linking member is retracted inside the base. When the driving member is moved from the unlocked position to the locked position, the second engaged portion is moved along a third direction to protrude from the base.

In an embodiment of the invention, the aforementioned first pivot portion is located between the second pivot portion and the third pivot portion.

In an embodiment of the invention, the aforementioned linkage mechanism further includes a third linking rod, including a plurality of second protruding portions, where the at least one first linking rod includes the plurality of first linking rods. The second protruding portions of the third linking rod respectively pass through the third pivot portions of the first linking rods and the second groove.

In an embodiment of the invention, the aforementioned base includes a second side wall, and a second opening formed on the second side wall. When the driving member is moved from the unlocked position to the locked position, the second engaged portion is moved along a wall surface of the second side wall surrounding the second opening in a third direction to protrude from the base.

In an embodiment of the invention, the aforementioned first pivot portion is located at a middle portion of the first linking rod. The second pivot portion is located at one end of the first linking rod.

Based on the above, the first body of the electronic device of the invention is disposed the linkage mechanism. The first linking rod is driven by the linkage mechanism via the driving member, the first linkage member is further driven, so that the first engaged portion protrudes from the base. The first engaged portion may extend into the recess hole of the first body to achieve the effect of fixing the first body to the second body. In addition, it is quite simple and convenient to be operated.

To make the aforementioned and other features and advantages of the invention more comprehensible, several embodiments accompanied with figures are described in detail as follows.

DESCRIPTION OF THE EXEMPLARY EMBODIMENTS

Figure 1:
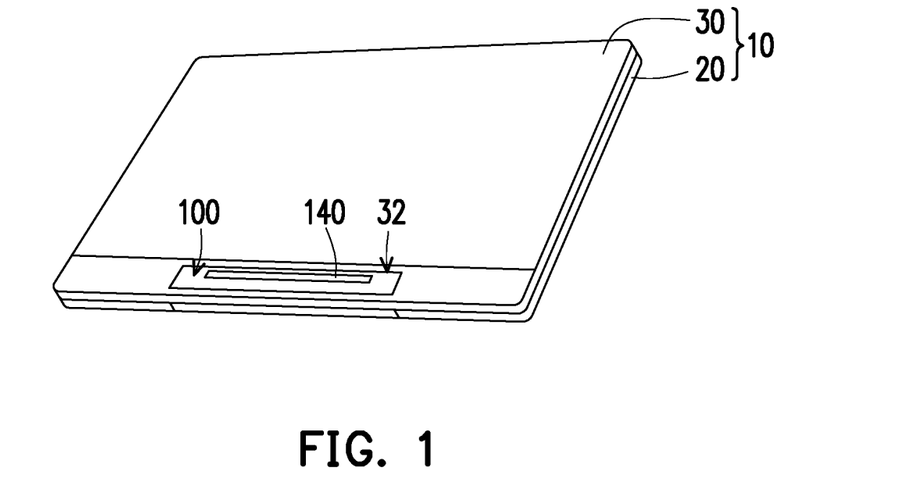
FIG. 1 is a schematic view of a first body of an electronic device assembled to a second body according to an embodiment of the invention.
Figure 2:
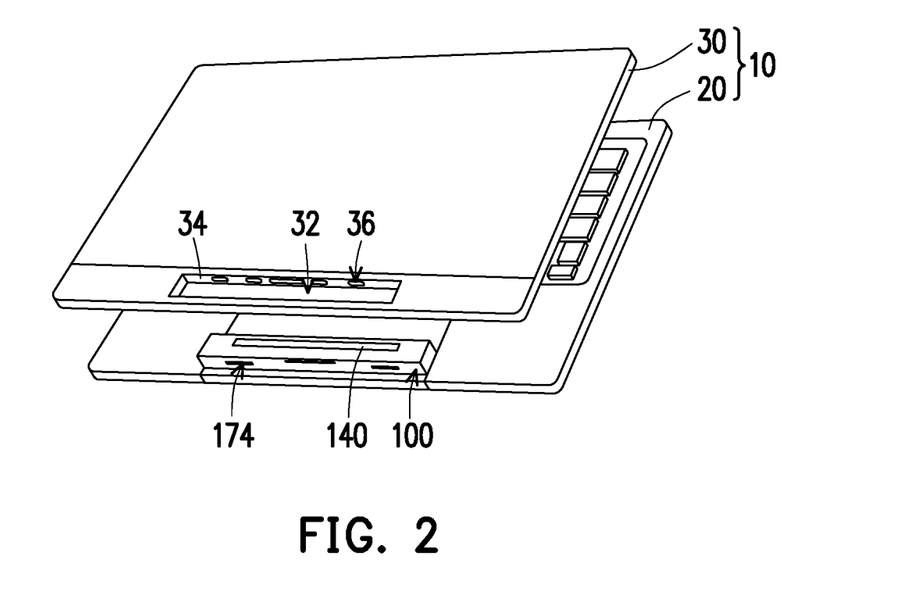
FIG. 2 is a schematic view of the first body of the electronic device of FIG. 1 separated from the second body.

FIG. 1 is a schematic view of a first body of an electronic device assembled to a second body according to an embodiment of the invention. FIG. 2 is a schematic view of the first body of the electronic device of FIG. 1 separated from the second body. Referring to FIG. 1 and FIG. 2, an electronic device 10 includes a first body 20 and a second body 30. In this embodiment, the electronic device 10 is, for example, a laptop. The first body 20 is, for example, a lower body of the laptop. The second body 30 may be, for example, an upper body of the laptop by combining to the first body 20, or a body independently used as the tablet. Indeed, the types of the electronic device 10, the first body 20, and the second body 30 are not limited herein.

As shown in FIG. 2, in this embodiment, the second body 30 may be detachably disposed on the first body 20. In this embodiment, the first body 20 includes a linkage mechanism 100. The second body 30 includes a through hole 32, a plurality of inner side walls 34 surrounding the through hole 32, and at least one recessed hole 36 recessed in one of the inner side walls 34. In this embodiment, the two opposite inner side walls 34 surrounding the through hole 32 respectively have the plurality of recessed holes 36. The linkage mechanism 100 of the first body 20 is adapted to be extended into the through hole 32 of the second body 30, and the linkage mechanism 100 has a fix structure for extending into the recessed holes 36, so that the second body 30 may be selectively fixed to the first body 20. Detailed descriptions of the linkage mechanism are described below.

Figure 3:
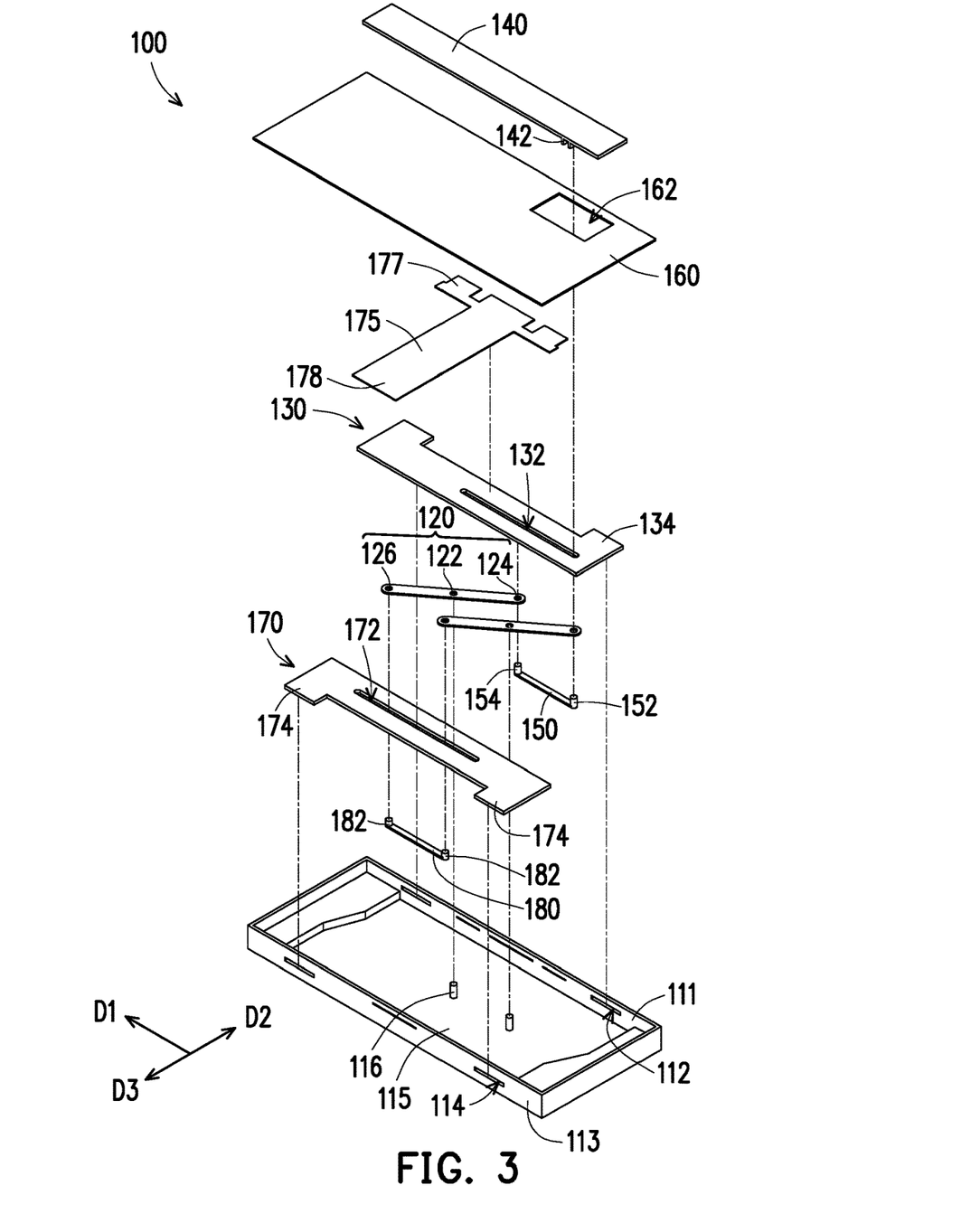
FIG. 3 is an exploded schematic view of a linkage mechanism of an electronic device of FIG. 1.
Figure 4:
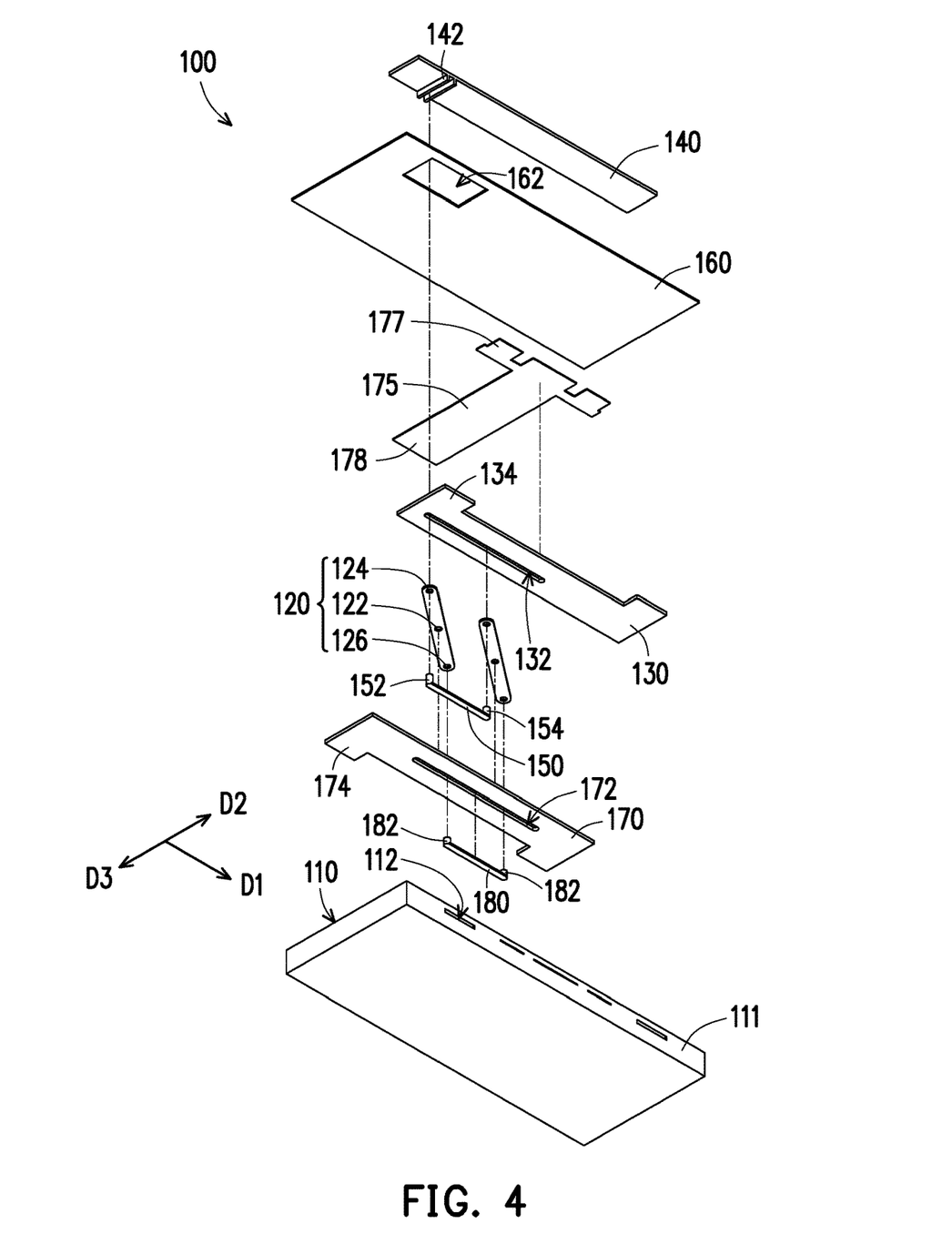
FIG. 4 is a schematic view of FIG. 3 from another perspective.

FIG. 3 is an exploded schematic view of a linkage mechanism of an electronic device of FIG. 1. FIG. 4 is a schematic view of FIG. 3 from another perspective. Referring FIG. 3 and FIG. 4, in this embodiment, the linkage mechanism 100 at least includes a base 110, at least one first linking rod 120, a first linkage member 130 and a driving member 140.

In this embodiment, the base 110 includes a first side wall 111, a first opening 112 formed on the first side wall 111, a second side wall 113, a second opening 114 formed on the second side wall 113, a bottom plate 115 connected between the first side wall 111 and the second side wall 113, and a protruded cylinder 116 protruding from the bottom plate 115.

In this embodiment, the number of the first linking rod 120 is, for example, two. However, the number of the first linking rod 120 may not be limited thereto. Each of the first linking rods 120 includes a first pivot portion 122 and a second pivot portion 124. The first linking rod 122 is located on a middle portion of the first linking rod 120. The second pivot portion 124 is located at one end of the first linking rod 120. Each of the first linking rods 120 is pivoted to the base 110 via the first pivot portion 120, and is rotated relative to the base 110. The first linkage member 130 includes a first engaged portion 134 and a first groove 132 along a first direction D1. The first engaged portion 134 of the first linkage member 130 corresponds to the first opening 112. Each of the first linking rods 120 is pivoted in the first groove 132 of the first linkage member 130 via the second pivot portion 124, and is adapted to be moved along the first groove 132, where the movement may be either movement along an axis or rotation.

In this embodiment, the driving member 140 is, for example, a push chip, providing a user to push. However, in other embodiments, the driving member 140 may be a memory alloy, driving the first linking rod 120 after being deformed by heat. The form of the driving member 140 is not limited thereto. In addition, in this embodiment, the first linking rod 120 is connected (or linked) to the driving member 140, and is adapted to be moved between an unlocked position P1 and a locked position P2. More specifically, in this embodiment, the linkage mechanism 100 may further selectively include a second linking rod 150. The second linking rod 150 includes a plurality of first protruding portions 152 and 154. The plurality of first protruding portions 152 and 154 of the second linking rod 150 respectively pass through the plurality of second pivot portions 124 of the first linking rod 120 and the first groove 132 of the first linkage member 130. In this embodiment, the driving member 140 includes a guide rail 42 along a second direction D2. The first protruding portion 152 extends into the guide rail 142. Therefore, when the driving member 140 is pushed, the first protruding portion 152 of the second linking rod 150 is driven. When the first protruding portion 152 is driven, the first linkage member 120 is moved, and the first linkage member 130 is thus driven.

In this embodiment, the linkage mechanism 100 may further selectively include a second linkage member 170, including a second engaged portion 174 and a second groove 172 along the first direction D1. The position of the second engaged portion 174 corresponds to the position of the second opening 114 of the base 110. Each of the first linking rods 120 includes a third pivot portion 126. Each of the first linking rods 120 is pivoted in the second groove 172 of the second linkage member 170 via the third pivot portion 126, and is adapted to be moved and rotated along the second groove 172. In this embodiment, the first pivot portion 122 is located between the second pivot portion 124 and the third pivot portion 126. The first pivot portion 122 is, for example, located in the middle portion of the first linking rod 120. The second pivot portion 124 and the third pivot portion 126 are, for example, located on the opposite sides of the first linking rod 120. However, the position and the relative relationship of the first pivot portion 122, the second pivot portion 124 and the third pivot portion 126 are not limited thereto.

In this embodiment, the linkage mechanism 100 may further selectively include a third linking rod 180, including a plurality of second protruding portions 182. The second protruding portions 182 of the third linking rod 180 respectively pass through the second groove 172 of the second linkage member 170 and the third pivot portions 126 of the first linking rods 120. Therefore, when the driving member 140 is pushed, the first protruding portion 152 of the second linking rod 150 is driven, and the first protruding portion 154 is moved correspondingly. On the other hand, when the first protruding portions 152 and 154 are moved, the second protruding portion 182 of the third linking rod 180 is moved, and the second linkage member 170 is moved correspondingly.

In addition, in this embodiment, the linkage mechanism 100 may further selectively include a connector 177, fixed to the first linkage member 130, and moved along the first linkage member 130. Specifically, in this embodiment, the connector 177 is disposed on a circuit board 175. The circuit board 175 is, for example, a flexible circuit board 175. However, the invention is not limited thereto. In this embodiment, the connector 177 is located at one side of the circuit board 175. The connector 177 is, for example, a connection pad formed on the circuit board 175. Alternatively, the connector 177 may also be in a dual in-line package (DIP) configuration or soldered to the circuit board 175. In this embodiment, the connector 177 is moved along the first linkage member 130, and protrudes from the base 110, and may be inserted to the recessed hole 36 on the second body 30 (as illustrated in FIG. 2). In addition, in this embodiment, the circuit board 175 further includes a connection port 178 connected to the first body 20 (as illustrated in FIG. 2). Therefore, when the connector 177 is inserted to the recessed hole 36 of the second body 30, the first body 20 is electrically connected to the second body 30.

In this embodiment, the linkage mechanism 100 may further selectively include a cover 160 disposed on the base 100. The connector 177, the first linkage member 130, the first linking rod 120, the second linking rod 150, the second linkage member 170, and the third linking rod 180 are disposed between the base 110 and the cover 160. The cover 160 includes a through groove 162. The driving member 140 may be movably disposed at the cover 160, and at least one of the guide rail 142 and the first protruding portion 152 extending into the guide rail 142 passes through the through groove 162.

Figure 5:
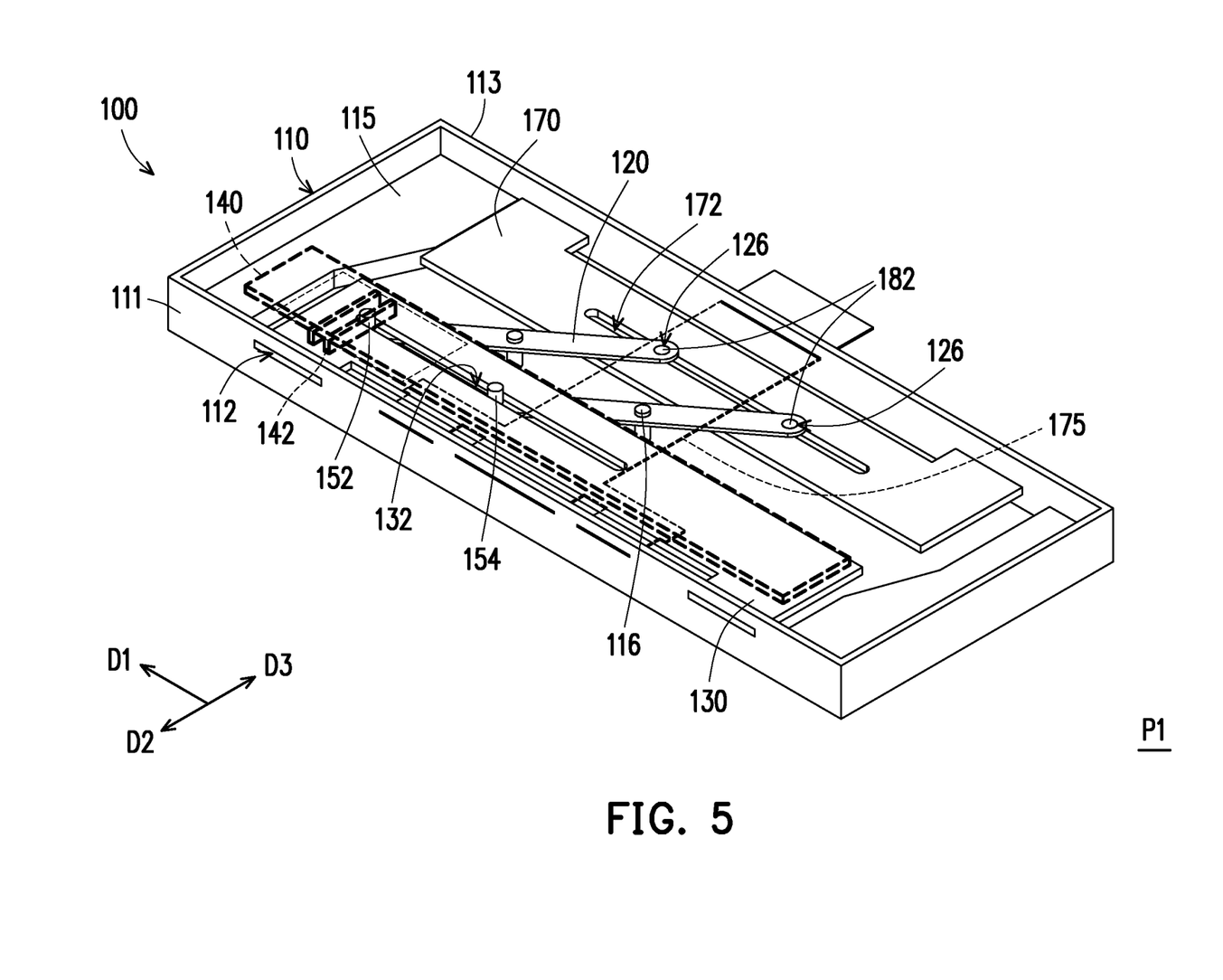
FIG. 5 is a three-dimensional schematic view of a driving member of a linkage mechanism of an electronic device of FIG. 1 located at an unlocked position.
Figure 6:
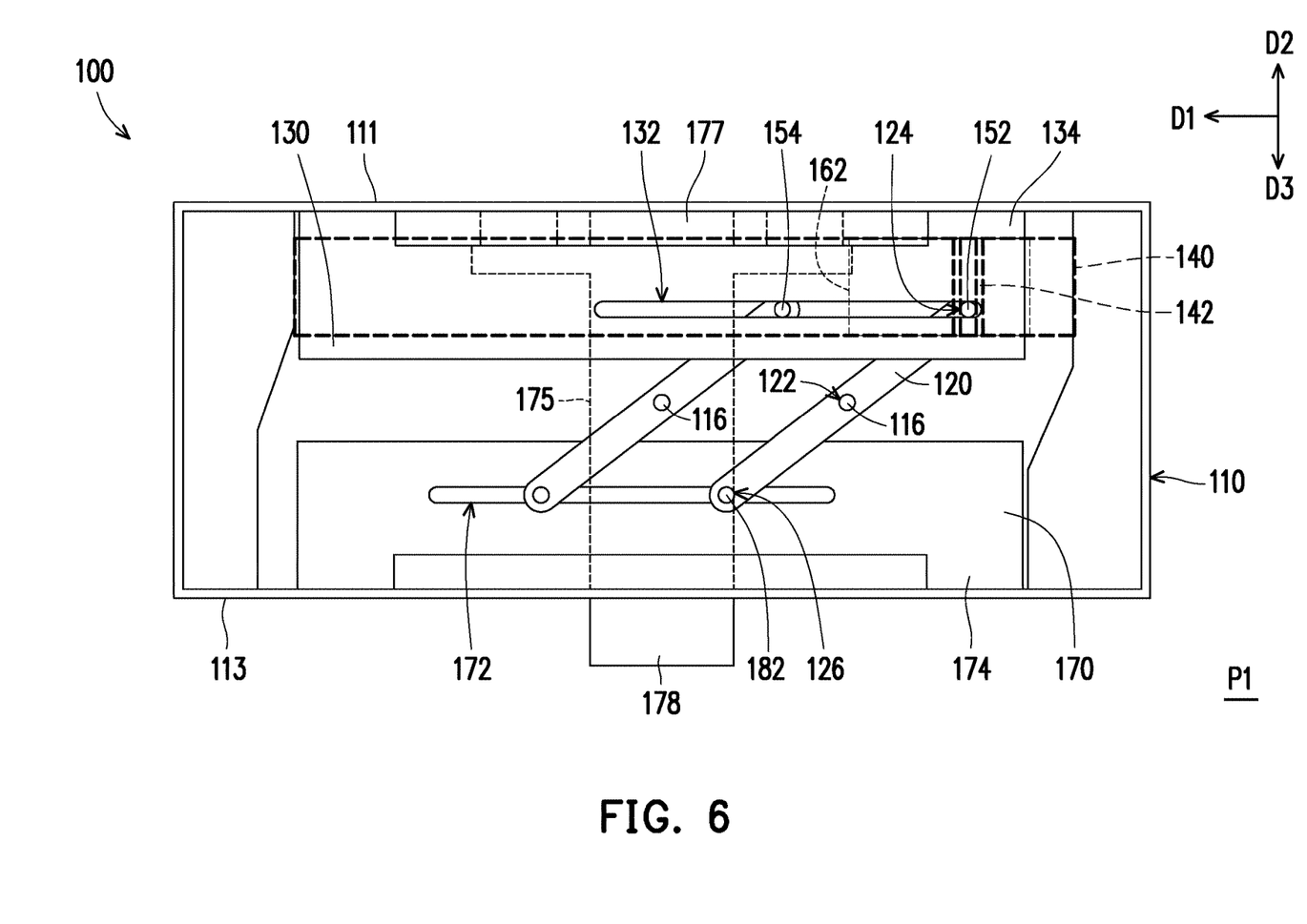
FIG. 6 is a top view of FIG. 5.

The movement of the linkage mechanism 100 is described as below. FIG. 5 is a three-dimensional schematic view of a driving member of a linkage mechanism of an electronic device of FIG. 1 located at an unlocked position. FIG. 6 is a top view of FIG. 5. It should be noted that the view angle of FIG. 5 is a view angle of the first side faced with the base 110. That is, the first lateral surface of the base 110 is close to the lower left side of FIG. 5. In FIG. 6, the first lateral surface of the base 110 is located at the above of FIG. 6. Please refer to FIG. 5 and FIG. 6. When the linkage mechanism 100 of the first body 20 extends into the through hole 32 of the second body 30, and the driving member 140 is located at the locked position P1, the first engaged portion 134 of the first linkage member 130, the second engaged portion 174 of the second linkage member 170 are retracted inside the base 110.

Figure 7:
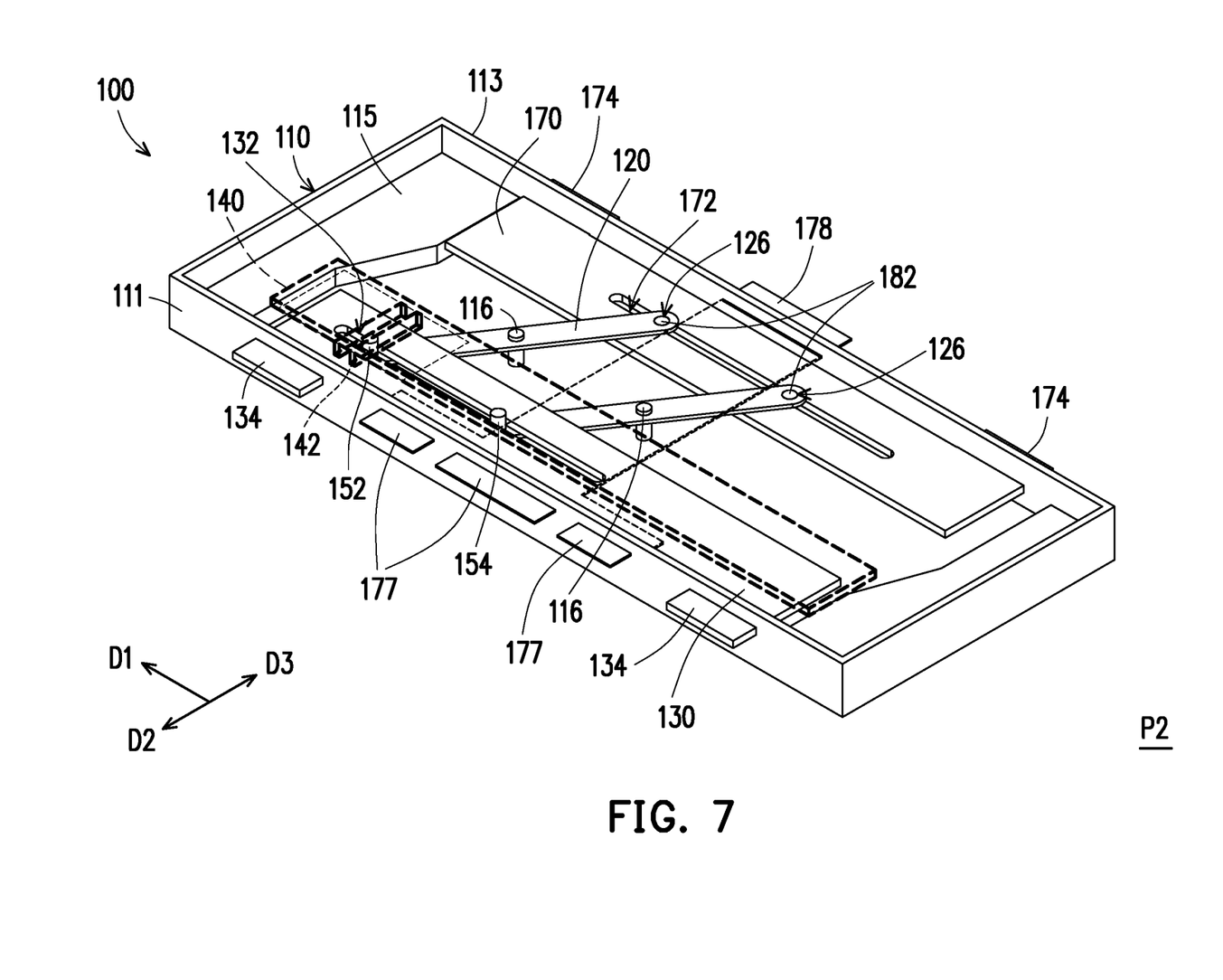
FIG. 7 is a three-dimensional schematic view of a driving member of a linkage mechanism of an electronic device of FIG. 1 located at an unlocked position.
Figure 8:
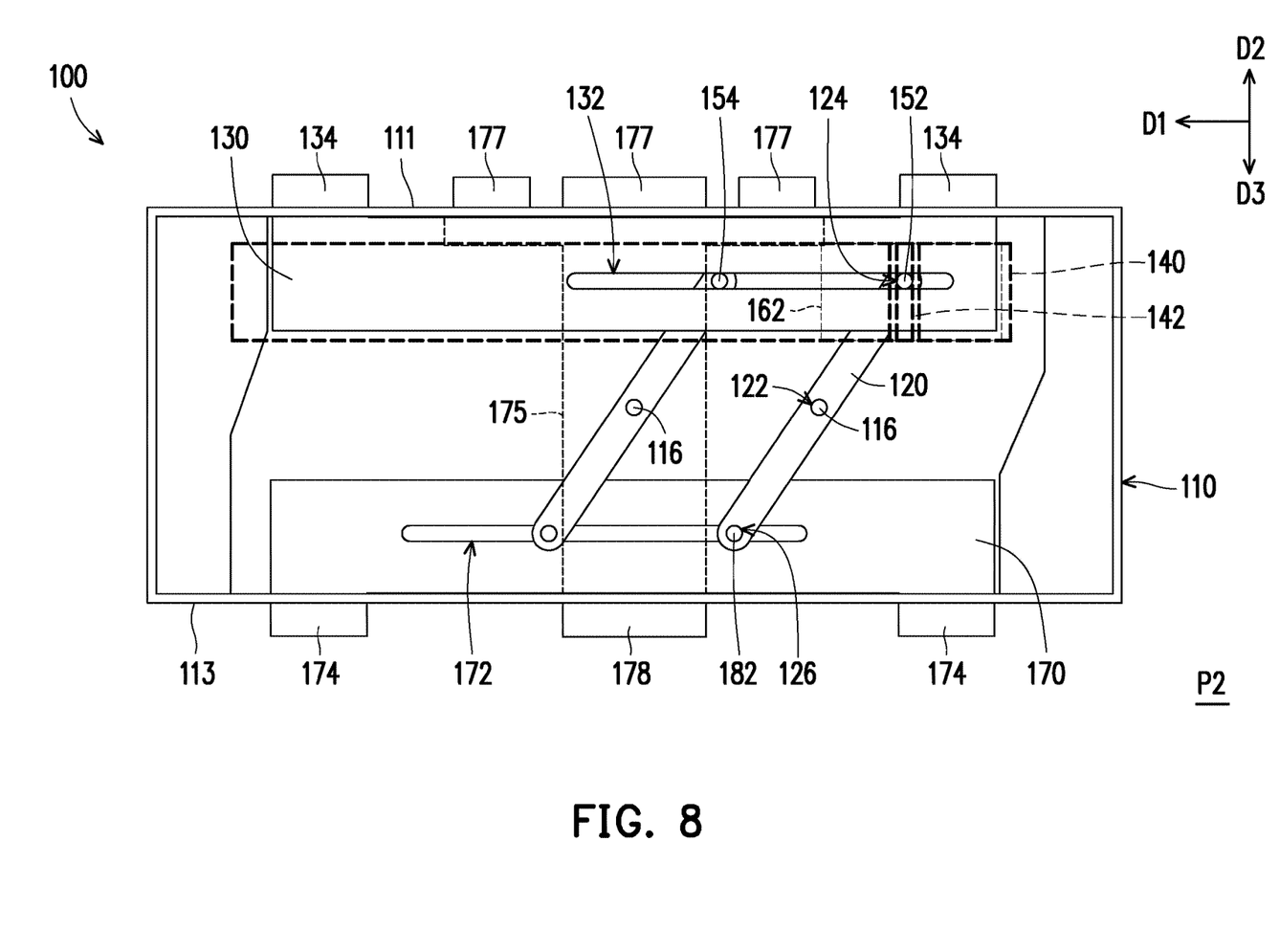
FIG. 8 is a top view of FIG. 7.

FIG. 7 is a three-dimensional schematic view of a driving member 140 of a linkage mechanism 100 of an electronic device 10 of FIG. 1 located at an unlocked position P2. FIG. 8 is a top view of FIG. 7. It should be noted that the view angle of FIG. 7 is similar to the view angle of FIG. 5. The view angle of FIG. 8 is similar to the view angle of FIG. 6. Please refer to FIG. 3, FIG. 7, and FIG. 8. When the driving member 140 is moved from the unlocked position P1 to the locked position P2, the first protruding portion 152 of the second linking rod 150 is driven by the guide rail 142 of the driving member 140. The second pivot portion 124 of the first linking rod 120 is driven by the protruding portions 152 and 154 of the second linking rods 150, so that the second pivot portion 124 of the first linking rod 120 is moved along the first groove 132. Since the first pivot portion 122 of the first linking rod 120 is pivoted to the protruded cylinder 116 of the base 110, when the second pivot portion 124 of the first linking rod 120 is driven, the second pivot portion 124 is rotated along the first pivot portion 122 which is as an axle, the first protruding portions 152 and 154 passing through the second pivot portion 124 push the wall surface of the first linkage member 130 beside the first groove 132, so that the first engaged portion 134 of the first linkage member 130 linkage member is moved along a wall surface of the first side wall 111 surrounding the first opening 112 in the second direction D2 to protrudes from the base 110 and is extended into the recessed hole 36 of the second body 30. The fixed effect is thus achieved. Meanwhile, the connector 177 is driven by the first linkage member 130, protrudes from the base 110, is extended into the recessed hole 36 on the second body 30, and is electrically connected to the second body 30.

Likewise, when the second pivot portion 124 of the first linking rod 120 is driven, and is rotated along the first pivot portion 122 which is as the axle, the third pivot portion 126 of the first linking rod 120 is rotated correspondingly. The second protruding portion 182 passing through the third pivot portion 126 pushes the wall of the second linkage member 170 beside the second groove 172, so that the second engaged portion 174 of the second linkage member 170 is moved along the wall of the second side wall 113 surrounding the second opening 114 in the third direction D3 to protrude from the base, and is extended into the recessed hole 36 on the second body 30. The fixed effect is thus achieved.

In summary, the first body of the invention is disposed a linkage mechanism. The first linking rod is driven by the linkage mechanism via the driving member, and the first linkage member is further driven, so that the first engaged portion is protruded from the base. The first engaged portion extends into the recess hole of the first body to achieve the effect of fixing the first body to the second body. In addition, it is quite simple and convenient to be operated.

It will be apparent to those skilled in the art that various modifications and variations can be made to the disclosed embodiments without departing from the scope or spirit of the invention. In view of the foregoing, it is intended that the invention covers modifications and variations of this invention provided that they fall within the scope of the following claims and their equivalents.

What is claimed is:

1. A linkage mechanism, comprising:
    a base;
    at least one first linking rod, comprising a first pivot portion and a second pivot portion, wherein each of the at least one first linking rod is pivoted to the base via the first pivot portion;
    a first linkage member, comprising a first engaged portion and a first groove extending along a first direction, wherein each of the at least one first linking rod is pivoted in the first groove of the first linkage member via the second pivot portion, and is adapted to be moved along the first groove; and
    a driving member, connected to the at least one first linking rod, and adapted to be moved between an unlocked position and a locked position, when the driving member is located at the unlocked position, the first engaged portion of the first linkage member being retracted inside the base,
    when the driving member is moved from the unlocked position to the locked position, the at least one first linking rod being driven by the driving member, so that the second pivot portion of the first linking rod is moved along the first groove, and the first linkage member is further driven and moved along a second direction, and the first engaged portion protrudes from the base.

2. The linkage mechanism according to claim 1, further comprising:
    a second linking rod, comprising a plurality of first protruding portions, wherein the at least one first linking rod comprises a plurality of first linking rods, and the plurality of first protruding portions of the second linking rod respectively pass through the second pivot portions of the first linking rods and the first groove of the first linkage member.

3. The linkage mechanism according to claim 2, wherein the driving member comprises a guide rail extending along the second direction, and one of the first protruding portions extends into the guide rail.

4. The linkage mechanism according to claim 3, further comprising:
    a cover, comprising a through groove, the driving member movably disposed at the cover, and at least one of the guide rail and the first protruding portion extending into the guide rail passing through the through groove.

5. The linkage mechanism according to claim 1, wherein the base comprises a first side wall and a first opening formed on the first side wall, when the driving member is moved from the unlocked position to the locked position, the first engaged portion of the first linkage member is moved along a wall surface of the first side wall surrounding the first opening in the second direction to protrude from the base.

6. The linkage mechanism according to claim 1, further comprising:
    a connector, fixed to the first linkage member, wherein when the driving member is located at the unlocked position, the connector is retracted inside the base, when the driving member is moved from the unlocked position to the locked position, the connector is driven by the first linkage member and protrudes from the base.

7. The linkage mechanism according to claim 1, further comprising:
    a second linkage member, comprising a second engaged portion and a second groove extending along a first direction, wherein each of the at least one first linking rod comprises a third pivot portion, each of the at least one first linking rod is pivoted in the second groove of the second linkage member via the third pivot portion so as to be adapted to be moved and rotated along the second grove, when the driving member is located at the unlocked position, the second engaged portion of the second linkage member is retracted inside the base, when the driving member is moved from the unlocked position to the locked position, the second engaged portion is moved along a third direction and protrudes from the base.

8. The linkage mechanism according to claim 7, wherein the first pivot portion is located between the second pivot portion and the third pivot portion.

9. The linkage mechanism according to claim 7, further comprising:
    a third linking rod, comprising a plurality of second protruding portions, wherein the at least one first linking rod comprises a plurality of first linking rods, the second protruding portions of the third linking rod respectively pass through the third pivot portions of the first linking rods and the second groove.

10. The linkage mechanism according to claim 7, wherein the base comprises a second side wall, and a second opening formed on the second side wall, when the driving member is moved from the unlocked position to the locked position, the second engaged portion is moved along a wall surface of the second side wall surrounding the second opening in a third direction to protrude from the base.

11. The linkage mechanism according to claim 1, wherein the first pivot portion is located at a middle portion of the first linking rod, and the second pivot portion is located at an end of the first linking rod.

12. An electronic device, comprising:
    a first body, comprising a linkage mechanism, wherein the linkage mechanism comprises:
        a base;
        at least one first linking rod, comprising a first pivot portion and a second pivot portion, wherein each of the at least one first linking rod is pivoted to the base via the first pivot portion;
        a first linkage member, comprising a first engaged portion and a first groove extending along a first direction, wherein each of the first linking rod is pivoted in the first groove of the first linkage member via the second pivot portion so as to be adapted to be moved along the first groove; and a driving member, connected to the at least one first linking rod, and adapted to be moved between an unlocked position and a locked position; and a second body, detachably disposed at the first body, and comprising a through hole, a plurality of inner side walls surrounding the through hole, and a recessed hole recessed in one of the inner side walls, wherein the linkage mechanism of the first body is adapted to be extended into the through hole of the second body, when the linkage mechanism of the first body is extended into the through hole of the second body, and the driving member is located at the unlocked position, the first engaged portion of the first linking member is retracted inside the base, when the driving member is moved from the unlocked position to the locked position, the at least one first linking rod is driven by the driving member, so that the second pivot portion of the first linking rod is moved along the first groove, the first linking member is further driven to be moved along the second direction, so that the first engaged portion protrudes from the base and extends into the recessed hole of the second body.

13. The electronic device according to claim 12, wherein the linkage mechanism further comprises:

a second linking rod, comprising a plurality of first protruding portions, wherein the at least one first linking rod comprises a plurality of first linking rods, the first protruding portions of the second linking rod respectively pass through the second pivot portions of the first linking rod and the first groove of the first linkage member.

14. The electronic device according to claim 13, wherein the driving member comprises a guide rail extending along the second direction, and one of the first protruding portions extends into the guide rail.

15. The electronic device according to claim 14, wherein the linkage mechanism further comprises:

a cover, comprising a through groove, the driving member movably disposed at the cover, and at least one of the guide rail and the first protruding portion extending into the guide rail passing through the through groove.

16. The electronic device according to claim 12, wherein the base comprises a first side wall and a first opening formed on the first side wall, when the driving member is moved from the unlocked position to the locked position, the first engaged portion of the first linkage member is moved along a wall surface of the first side wall surrounding the first opening in the second direction to protrude from the base.

17. The electronic device according to claim 12, wherein the linkage mechanism further comprises:

a connector, fixed to the first linkage member, when the driving member is located at the unlocked position, the connector is retracted inside the base, when the driving member is moved from the unlocked position to the locked position, the connector is driven by the first linkage member and protrudes from the base.

18. The electronic device according to claim 12, wherein the linkage mechanism further comprises:

a second linkage member, comprising a second engaged portion and a second groove extending along the first direction, wherein each of the at least one first linking rod comprises a third pivot portion, each of the at least one first linking rod is pivoted in the second groove of the second linkage member via the third pivot portion so as to be adapted to be moved and rotated along the second groove, when the driving member is located at the unlocked position, the second engaged portion of the second linkage member is retracted inside the base, when the driving member is moved from the unlocked position to the locked position, the second engaged portion is moved along a third direction to protrude from the base.

19. The electronic device according to claim 18, wherein the first pivot portion is located between the second pivot portion and the third pivot portion.

20. The electronic device according to claim 18, wherein the linkage mechanism further comprises:

a third linking rod, comprising a plurality of second protruding portions, wherein the at least one first linking rod comprises a plurality of first linking rods, the second protruding portions of the third linking rod respectively pass through the third pivot portions of the first linking rods and the second groove.

21. The electronic device according to claim 18, wherein the base comprises a second side wall and a second opening formed on the second side wall, when the driving member is moved from the unlocked position to the locked position, the second engaged portion is moved along a wall surface of the second side wall surrounding the second opening in a third direction to protrude from the base.

22. The electronic device according to claim 12, wherein the first pivot portion is located at a middle portion of the first linking rod, and the second pivot portion is located at one end of the first linking rod.

* * * * *